(12) United States Patent
Dastidar et al.

(10) Patent No.: US 7,581,199 B1
(45) Date of Patent: Aug. 25, 2009

(54) USE OF STATE NODES FOR EFFICIENT SIMULATION OF LARGE DIGITAL CIRCUITS AT THE TRANSISTOR LEVEL

(75) Inventors: Tathagato Rai Dastidar, Bangalore (IN); Amir Yashfe, Tel-Mord (IL); Partha Ray, Bangalore (IN)

(73) Assignee: National Semiconductor Corporation, Santa Clara, CA (US)

(*) Notice: Subject to any disclaimer, the term of this patent is extended or adjusted under 35 U.S.C. 154(b) by 415 days.

(21) Appl. No.: 11/199,535

(22) Filed: Aug. 8, 2005

(51) Int. Cl.
*G06F 17/15* (2006.01)
(52) U.S. Cl. ............... 716/4; 716/5; 716/6; 703/13; 703/14; 703/15; 703/16; 703/17; 703/19
(58) Field of Classification Search ............ 716/4–6; 703/13–17, 19
See application file for complete search history.

(56) References Cited

U.S. PATENT DOCUMENTS

| | | | | |
|---|---|---|---|---|
| 5,163,016 A * | 11/1992 | Har'El et al. | ............... | 716/5 |
| 5,481,469 A * | 1/1996 | Brasen et al. | ............... | 702/60 |
| 5,550,760 A * | 8/1996 | Razdan et al. | ............... | 703/14 |
| 5,666,288 A * | 9/1997 | Jones et al. | ............... | 716/17 |
| 5,668,732 A * | 9/1997 | Khouja et al. | ............... | 702/60 |
| 5,748,486 A * | 5/1998 | Ashar et al. | ............... | 716/18 |
| 6,009,256 A * | 12/1999 | Tseng et al. | ............... | 703/13 |
| 6,148,436 A * | 11/2000 | Wohl | ............... | 716/18 |
| 6,182,268 B1 * | 1/2001 | McElvain | ............... | 716/1 |
| 6,499,129 B1 * | 12/2002 | Srinivasan et al. | ............... | 716/4 |
| 6,625,786 B2 * | 9/2003 | Ganesan et al. | ............... | 716/5 |
| 6,807,520 B1 * | 10/2004 | Zhou et al. | ............... | 703/14 |
| 7,216,307 B1 * | 5/2007 | Dastidar et al. | ............... | 716/1 |
| 2003/0036894 A1 * | 2/2003 | Lam | ............... | 703/19 |
| 2004/0044510 A1 | 3/2004 | Zolotov et al. | ............... | 703/14 |
| 2004/0078175 A1 * | 4/2004 | Shaw et al. | ............... | 703/14 |
| 2006/0074622 A1 * | 4/2006 | Scott et al. | ............... | 703/23 |

OTHER PUBLICATIONS

Jones; "Accelerating switch-level simulation by function caching"; Design Automation Conference, 1991; 28th ACM/IEEE; Publication Date: 1991; pp. 211-214.*
T.-K. Ng et al., "Generation of Layouts from MOS Circuit Schematic: A Graph Theoretic Approach," *22nd Design Automation Conference—IEEE* (1985), pp. 39-45.
N.V. Shakhlevich et al., "Adaptive scheduling algorithm based on mixed graph model," *IEEE Proc.—Control Theory Appl.*, vol. 143, No. 1, Jan. 1996, pp. 9-16.
L.G. Jones et al., "Hierarchical VLSI Design Systems Based on Attribute Grammars," *ACM* (1986), pp. 58-69.
K.M. Chandy et al., "Distributed Computation of Graphs: Shortest Path Algorithms," *ACM* (1982), pp. 833-837.

(Continued)

*Primary Examiner*—Naum B Levin
(74) *Attorney, Agent, or Firm*—Dergosits & Noah LLP

(57) ABSTRACT

An integrated circuit design simulation method is provided that takes advantage of the fact that, when an instance of a circuit module has been simulated under a given set of input conditions, and the resulting output values and delays have been evaluated, another instance of the same module need not be re-simulated when it has the same input combination as the prior circuit module instance. The results computed earlier for the earlier circuit module instance can be re-used for the current circuit module instance.

2 Claims, 5 Drawing Sheets

OTHER PUBLICATIONS

P.A. Beerel et al., "Testability of Asynchronous Timed Control Circuits with Delay Assumptions," *28th ACM/IEEE Design Automation Conference—ACM* (1991), pp. 446-451.

D. Adler, "Switch-Level Simulation Using Dynamic Graph Algorithms," *IEEE Transactions on Computer-Aided Design*, vol. 10, No. 1, Mar. 1991, pp. 346-355.

\* cited by examiner

USE OF STATE NODES FOR EFFICIENT SIMULATION OF LARGE DIGITAL CIRCUITS AT THE TRANSISTOR LEVEL

TECHNICAL FIELD

The present invention relates to integrated circuit design methodologies and, in particular, to the basic design of a hierarchical device level digital simulator that utilizes the native module hierarchy of a digital circuit for efficient simulation.

DISCUSSION OF THE RELATED ART

Software programs for use in simulating integrated circuit design and predicting the operational behavior of the circuit are well known to those skilled in the art.

SUMMARY OF THE INVENTION

FIG. 1 shows a well-known general architecture of a data processing system 100 that can be utilized to execute a program implementation of a digital integrated circuit simulator. The data processing system 100 includes a central processing unit (CPU) 102 and a system memory 104 that is connected to the CPU 102. The system memory 104 typically stores the operating system for the CPU 102 as well as data and various sets of program instructions for applications programs to be executed by the system 100. For example, the system memory 104 could store a software program, i.e. a sequence of machine readable program instructions, needed to implement a method for using state nodes for the efficient simulation of digital integrated circuits at the transistor level in accordance with the concepts of the present invention. Typically, the computer system 100 also includes a display 106 that is connected to the CPU 102 to allow images to be visually displayed to a user, a user input system 108, e.g., a keyboard or mouse, that allows the user to interact with the system 100, and a memory access system 110 that enables transfer of data both within the system 100 and between the system 100 and systems external to the system 100, e.g. a computer network to which the system 100 is connected. All of these components and the ways in which they interact are well known to persons skilled in the art.

Conventional device level digital integrated circuit simulators, such as the well-known public domain tool IRSIM, supported by the University of California—Berkeley, work on "flat" circuits, that is, circuits that have no module hierarchy. Thus, a hierarchical circuit must be flattened to transistor level before it will work on these conventional simulators. This approach has a major drawback. Most digital circuits, whether custom designed (e.g., memories) or standard cell based (e.g., ASICs), make extensive re-use of the same building blocks or lower level modules. For example, the major portion of a static random access memory (SRAM) circuit is made up of multiple repetitions of the same six-transistor memory core cell. A flattened netlist for the SRAM design does not reflect this fact. Simulations of identical circuit modules are repeated for each occurrence of the module in the circuit, resulting in a relatively time-consuming operation.

A simulation method in accordance with the present invention takes advantage of the fact that, when an instance of a circuit module has been simulated under a given set of input conditions, and the resulting output values and delays have been evaluated, another instance of the same module need not be re-simulated when it has the same input combination as the prior module instance; the results computed earlier for the earlier module instance can be re-used for the current instance.

The features and advantages of the various aspects of the present invention will be more fully understood and appreciated upon consideration of the following detailed description of the invention and the accompanying drawings, which set forth illustrative embodiments in which the concepts of the invention are utilized.

DETAILED DESCRIPTION OF THE INVENTION

Figure 2:
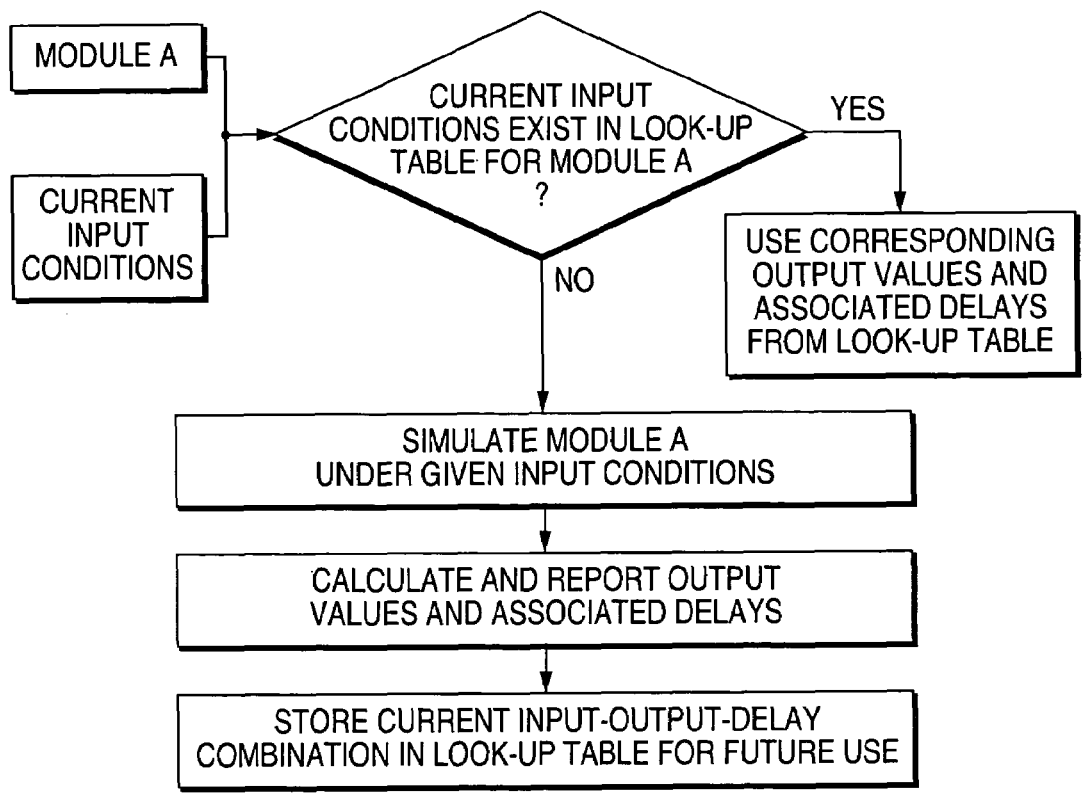
FIG. 2 is a flow chart illustrating a method of simulating combinatorial logic modules in accordance with the concepts of the present invention.

FIG. 2 shows a flow chart of a method of simulating combinatorial logic modules in accordance with the concepts of the present invention. As shown in FIG. 2, for a module A in the hierarchy of an integrated circuit design, a look-up table is maintained that stores the input-output combinations encountered for any instance of module A. When an instance of module A needs re-simulation (i.e., one or more of its inputs change value), the look-up table is checked to determine if the current input values have been encountered in an earlier simulation of module A. If they have, then the output and delay values stored in the look-up table are used and a complete re-simulation of this instance of module A is avoided. This drastically reduces the simulation time. When the current input values for that instance of module A are not present in the look-up table, then a simulation is performed and the output and delay results for that instance of module A are stored in the look-up table and can be used in future re-simulations of any other instance of module A.

The method described above works for purely combinatorial modules, since the output values and delays of a combinatorial module are governed solely by its inputs. However, for sequential modules, the output conditions of the module depend not only upon the inputs, but also upon the present state of the module. Thus, for sequential circuits, not only the input-output combinations, but also the states must be stored. For each instance of a module in the sequential circuit, its present state must be stored in the look-up table. During a simulation, the output combinations of that instance of the module are determined based upon the input values and the present state. After the simulation, the state of the module instance is updated to the next state. As is well known, this relation can be expressed as:

$$(O,NS)=f(I,PS) \quad (1)$$

where, O is the output vector, NS is the next state, I is the input vector, PS is the present state, and f is a Boolean function.

The problem is how to define what is meant by a "state" of a sequential module. One obvious (recursive) definition is as follows. The state of a module is defined by: (1) the state (logic value) of all of the internal nodes in the circuit; and (2) the state of all sub-modules of this module. However, this "obvious" definition has two major problems. First, storing the value of all of the internal nodes in a module for all instances of that module has a huge memory overhead and a look-up table search time penalty. Second, some (or all) of the sub-modules of a module may be combinatorial in nature, making it is unnecessary to store their states.

The present invention makes use of "state nodes" to circumvent the above-described problem. Intuitively, a state node is a node that can retain its logic value even in the absence of an input directly driving this node. In accordance with the invention, a circuit module is termed sequential if either of the following conditions holds true: (1) the module has state nodes or (2) the module has one or more sequential sub-modules.

The "state" of a sequential module is defined as follows. The state consists of: (1) the state (logic value) of all state nodes of the module and (2) the state of all sequential sub-modules of the module. Since the number of state nodes in a circuit is much less than the number of internal nodes, this definition of a module state is much more efficient in terms of both space as well as lookup time than the earlier definition.

Figure 1:
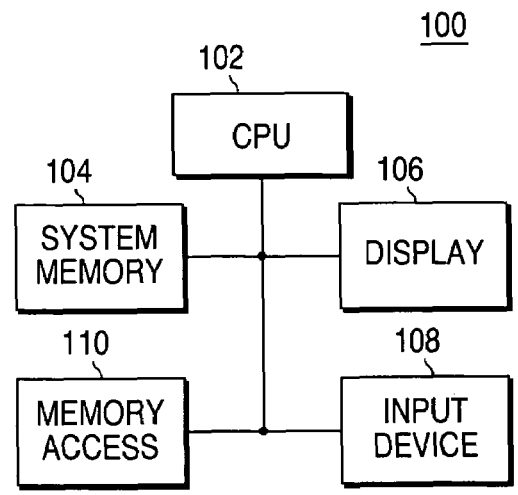
FIG. 1 is a block diagram illustrating a conventional data processing system.
Figure 3:
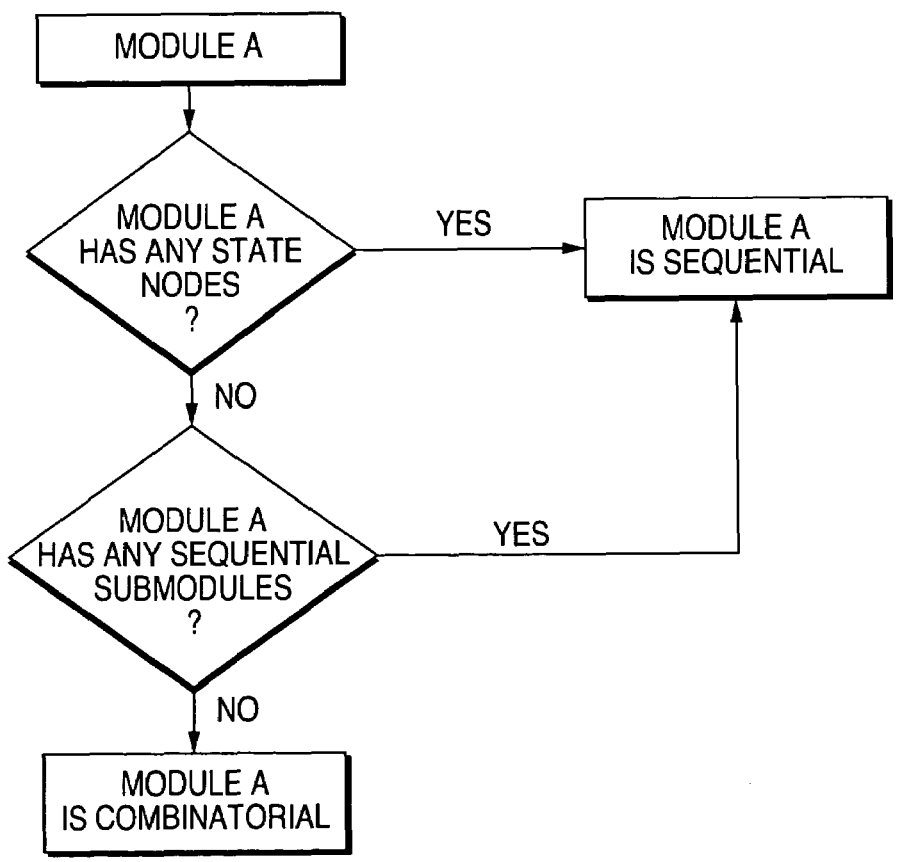
FIG. 3 is a flow chart illustrating a method of distinguishing between combinatorial logic circuit modules and sequential circuit modules.

The FIG. 3 flow chart summarizes the process of distinguishing between combinatorial modules and sequential modules. As shown in the FIG. 3 flow, if a module A has any state nodes, then it is defined as a sequential module. If the module A has no state nodes, but includes sequential submodules, then it is defined as a sequential module. If module A has neither state nodes nor sequential submodules, then it is defined a combinatorial module and may be simulated as such in accordance with the FIG. 2 flow described above.

Figure 4:
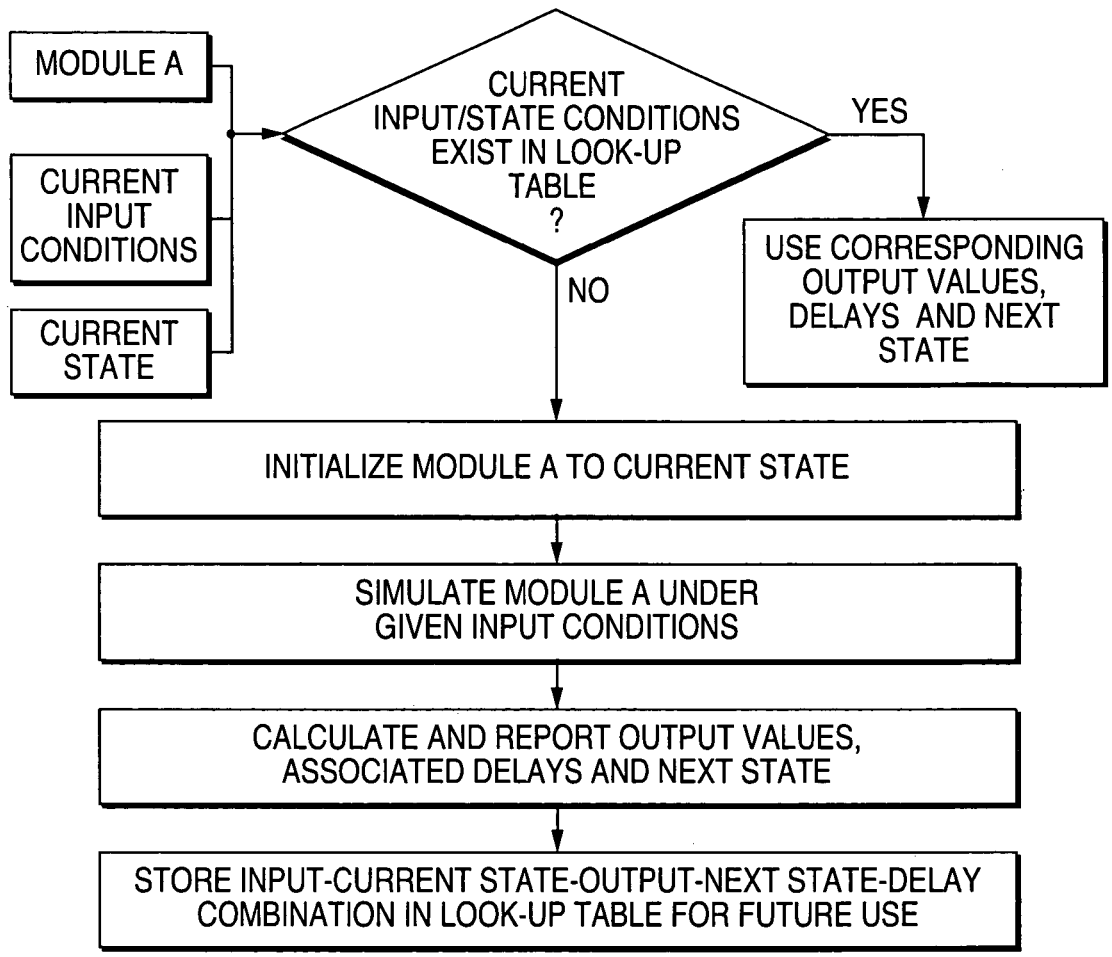
FIG. 4 is a flow chart illustrating a method of simulating sequential circuit modules I accordance with the concepts of the present invention.

With reference to the FIG. 4 flow chart, in accordance with the present invention, simulation of an instance of a sequential module A proceeds as follows. If the combination of the current inputs to the sequential module A and its current state exists in the look-up table, then the stored output combinations for this instance of module A are used and the current state is updated to the next state from the look-up table. Otherwise, all state nodes of the module A are initialized to the values stored in the current state. All sequential sub-modules are initialized to their states as stored in the current state. The input stimulus is provided and this instance of module A is simulated. When simulation of this instance of module A is completed (i.e., either there are no pending events or the simulation time is up), the output values are returned to storage in the look-up table. The next state of the module is then created and the values of all state nodes and the states of all sequential sub-modules are stored in the next state. Not only the last obtained value of a state node, but also the other values it receives during the simulation are stored. If a state node changes value more than once (e.g., in case of a pulse), then all value changes are stored.

In addition to the state points described above, some sequential circuits may also have "transient state points."

Sequential circuits have stable state points that are capable of retaining their state (logic value) even in the absence of any input directly driving these points. A method for automatically identifying stable state points in transistor level digital circuits is described in detail in co-pending and commonly assigned U.S. patent application Ser. No. 11/167,523, filed on Jun. 27, 2005, and titled "Method of Identifying State Nodes at the Transistor Level in a Sequential Digital Circuit." In the method disclosed in application Ser. No. 11/167,523, a number of minimum combinatorial feedback loops that are present in the circuit are identified. Each minimum combinatorial feedback loop has at least one driver node. A driver node from each minimum combinatorial feedback loop is assigned to be a state node in accordance with predefined criteria. Application Ser. No. 11/167,523 is hereby incorporated by reference in its entirety to provide background information regarding the present invention.

In addition to stable state points, some custom designed digital circuits include what will be referred to herein as "transient state points." A "transient state point" is defined as follows: a node that can directly affect the value of a state point and is combinatorially driven by inputs of the circuit, but the transition delay from at least one input to the node is greater than a predefined threshold value.

Transient state points need to be identified as state points for the hierarchical simulator of the present invention to function properly. This is the case because, after every simulation of a given module, the simulator "forgets" the values at all internal nodes in the circuit, except the state points (in case of sequential circuits). The next time the module is simulated, the state points are initialized to their logic values in the previous state. All other internal nodes are initialized to X (unknown) logic state. If the transient state points ate not identified as state points, then they too are initialized to X. Due to the propagation delay from the inputs, these points do not reach a valid logic value immediately. Since they can directly affect the value of stable state points, a stable state point can lose its value (and become X) if the transient state points remain at X for a considerable period of time. Hence, these points need to be identified as state points so that they will be initialized to a non-X logic value during the next simulation and prevent the stable state points from losing their values.

Figure 5:
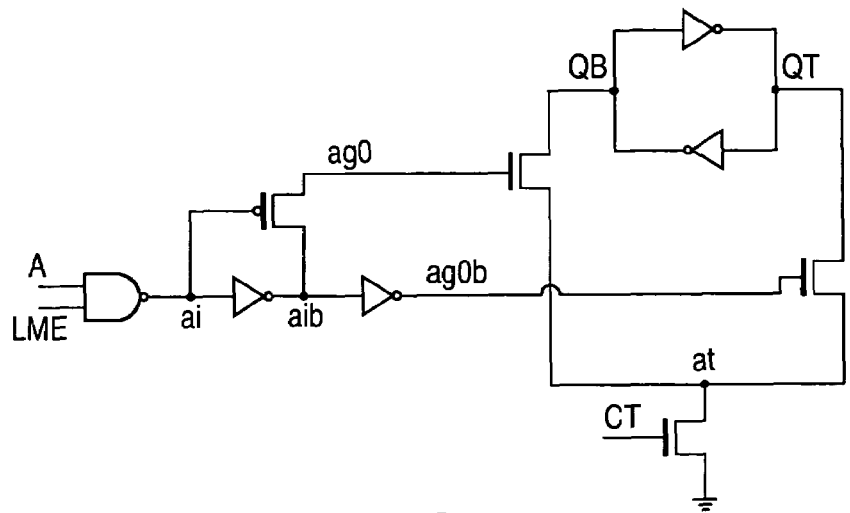
FIG. 5 is a schematic drawing illustrating an embodiment of a conventional circuit containing transient state points.

An example circuit containing transient state points is shown in FIG. 5. In the FIG. 5 circuit, the stable state points are QB and QT, and can be detected by the state point detection algorithm described in above-referenced application Ser. No. 11/167,523. The nodes ag0 and ag0b are transient state points, since they affect the stable state points and the propagation delay from the inputs to these nodes is higher than a predefined threshold. The FIG. 5 circuit is a module of a CMOS single-port SRAM circuit.

An algorithm for detecting transient state points in accordance with the concepts of the present invention will now be described with reference to the FIG. 6 flow chart.

A graph $G=(V, E_1, E_2)$ is defined where V is a set of vertices, $E_1$ is a set of directed edges, and $E_2$ is a set of undirected edges. There can be both a directed edge and an undirected edge between a pair of vertices in the graph. Given the schematic of a circuit containing stable state points, such a graph is constructed by applying the following rules: (1) for each node in the circuit (including input, output, inout and internal nodes of the circuit), a vertex is created in the graph, (2) for every transistor in the circuit, a directed edge is added from the vertex representing the gate node to the vertex representing the source node, a directed edge is added from the vertex representing the gate node to the vertex representing the drain node, and an undirected edge is added between the source and drain nodes, and (3) for every submodule in the circuit, a directed edge is added from each input of the submodule to all of its outputs.

If there is a directed edge from vertex A to vertex B, then vertex A is denoted as the "parent" of vertex B. Two vertices connected by an undirected edge are called "peers." The "weight" of all edges is taken as 1.

Figure 7:
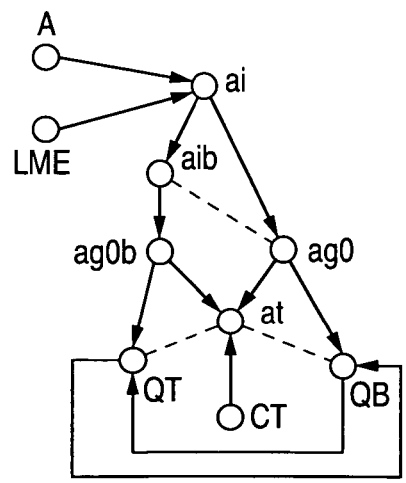
FIG. 7 is a graph representation of the FIG. 5 circuit created in accordance with the FIG. 6 flow chart.
Figure 6:
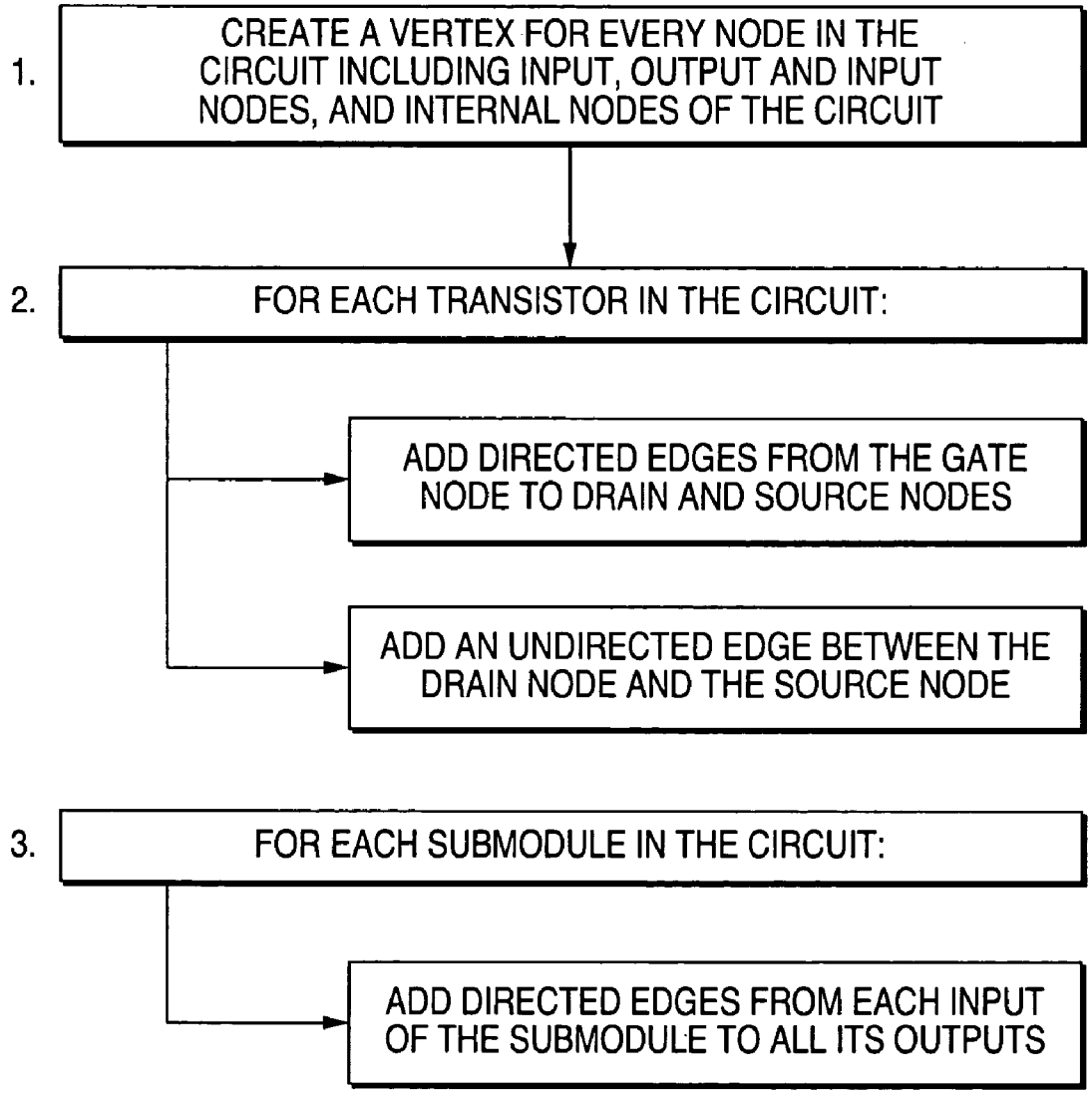
FIG. 6 is a flow chart illustrating a method of constructing a graph from a circuit netlist.

The graph created from the schematic of FIG. 5 in accordance with the FIG. 6 flow is shown in FIG. 7. The power supply and group vertices have been omitted for brevity. The directed edges are shown as arrows and the undirected edges are shown as dotted lines.

Figure 8:
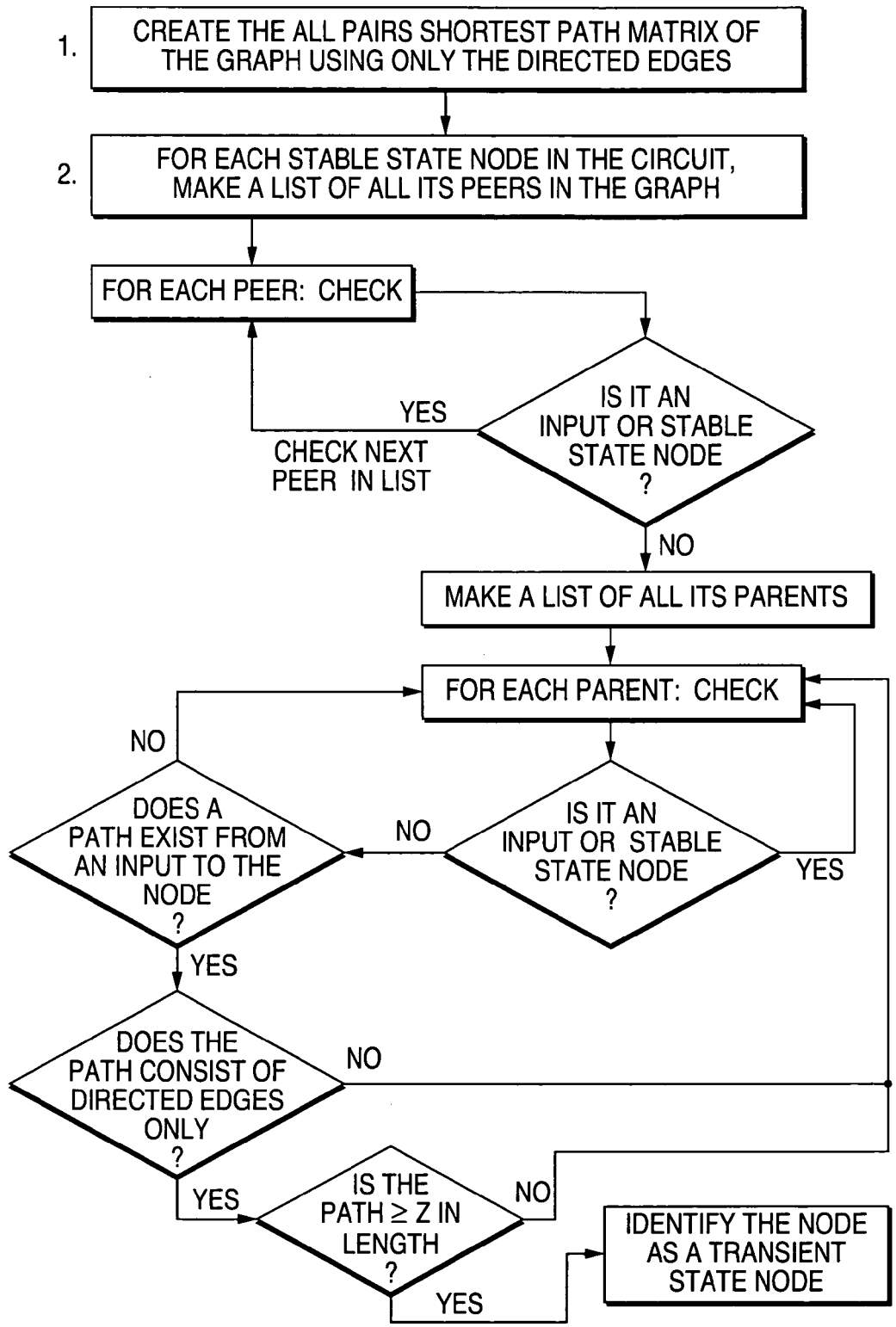
FIG. 8 is a flow chart illustrating a method of indentifying transient state nodes from the graph representation of the circuit.

Referring to the FIG. 8 flow chart, once a graph of the type shown in FIG. 7 has been created, the following steps are applied. Using only the directed edges, the all-pairs shortest path matrix of the graph is created, denoting the minimum path length between all pairs of vertices. This can be done using the standard Floyd Warshall's algorithm. If no path exists between a pair of nodes, then the path length is taken to be infinity. For each stable state point, a list of all it peers is made. For each such peer, if it is not an input or a stable state point, a list of all its parents is made. For each such parent, if it is not an input or a stable state point, if a path consisting of directed edges only exists from any input to the vertex, and the length of that path is greater than or equal 2, then it taken as a transient state point.

In the FIG. 7 graph, QB and QT are stable state points, and their peer is the vertex at. Vertex at has three parents: node ag0, node ag0b and CT. CT is an input, so it cannot be a state point. Paths exist from A and LME (both are inputs) to both node ag0 and node ag0b, and each path is greater than or equal to two edges in length. Hence, node ag0 and node ag0b are detected to be transient state points.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of simulating a specific digital integrated circuit design having a plurality of circuit modules that includes a plurality of identical circuit modules, each circuit module in the digital integrated circuit design providing a set of output results in response to a specific set of input signals applied to said circuit module, the output results including delay values and output values, the simulation method comprising:

providing a simulation computing system that executes a set of instructions for simulating digital integrated circuitry;

utilizing the simulation computing system to perform a simulation iteration in which each circuit module included in the digital integrated circuit design is sequentially simulated based upon a set of input conditions for said circuit module to provide an associated set of output results for combinatorial modules and, in addition, the resulting state (next state) for sequential circuit modules;

for each simulation of a circuit module, storing the associated set of output results for combinatorial modules and both output results and next state for sequential modules in a look-up table storage device that is included in the simulation computing system;

for each simulation of a subsequent circuit module in the sequence of circuit modules to be simulated, determining if the subsequent circuit module is identical to a previously simulated circuit module;

for each subsequent identical circuit module to be simulated based upon a current set of input conditions for combinatorial circuit modules or the current set of input conditions and current state for sequential circuit modules, determining whether the look-up table storage device stores an associated set of output results for combinatorial circuit modules or both output results and next state for sequential circuit modules for the current set of input conditions for combinatorial circuit modules or the current set of input conditions and current state for sequential circuit modules;

in the event that the look-up table storage device does contain such a set of output results for combinatorial circuit modules or both output results and next state for sequential circuit modules, utilizing those results as the simulation results of said subsequent identical circuit module; and in the event that the look-up table storage device does not contain such a set of results, utilizing the simulation computing system to simulate said subsequent circuit module based upon the current set of input conditions for combinatorial circuit modules or both the current set of input conditions and current state for sequential circuit modules to provide a set of associated current output results for combinatorial circuit modules or a set of associated current output results and next state for sequential circuit modules and storing the results in the look-up table storage device, whereby identical circuit modules included in the digital integrated circuit design need not be re-simulated in a simulation iteration performed by the simulation computing system when said identical circuit modules have the same input conditions.

2. A machine-readable storage device having stored thereon sequences of instructions for implementation by a simulation computing system of a method of simulating a digital integrated circuit design having a plurality of circuit modules that includes a plurality of identical circuit modules, wherein each circuit module provides a set of output results in response to a specific set of input signals applied to said circuit module, the output results including delay values and output values, the instruction sequences including instructions that, when executed by the simulation computing system, cause the simulation computing system to perform the steps of:

sequentially simulating each circuit module included in the digital integrated circuit design based upon a set of input conditions for said circuit module to provide an associated set of output results for combinatorial circuit modules and, in addition, the resulting state (next state) for sequential circuit modules;

for each simulation of a circuit module by the simulation computing system, storing the associated set of output results for combinatorial circuit modules and both output results and next state for sequential circuit modules in a look-up table storage device that is in the simulation computing system;

for each simulation of a subsequent circuit module I the sequence of circuit modules to be simulated, determining if the subsequent circuit module is identical to a circuit module that has been previously simulated in said simulation iteration;

for each subsequent identical circuit module to be simulated based upon a current set of input conditions for combinatorial circuit modules or the current set of input conditions and current state for sequential circuit modules, determining whether the look-up table storage device contains an associated set of output results for combinatorial circuit modules or both output results and next state for sequential circuit modules for the current set of input conditions for combinatorial circuit modules or the current set of input conditions and current state for sequential circuit modules;

in the event that the look-up table storage device does contain such a set of output results for combinatorial circuit modules or both output results and next state for sequential circuit modules, utilizing those results as the simulation results of said subsequent identical circuit module; and in the event that the look-up table storage device does not contain such a set of results, utilizing the simulation computing system to simulate said circuit module based upon the current set of input conditions for combinatorial circuit modules or both the current set of input conditions and current state for sequential circuit modules to provide a set of associated current output results for combinatorial circuit modules or a set of associated current output results and next state for sequential circuit modules and storing the results in the look-up table storage device, whereby identical circuit modules included in the digital integrated circuit design need not be re-simulated in a simulation iteration performed by the simulation computing system when said identical circuit modules have the same input conditions.

* * * * *